(12) United States Patent
Burgess et al.

(10) Patent No.: US 11,802,341 B2
(45) Date of Patent: Oct. 31, 2023

(54) PE-CVD APPARATUS AND METHOD

(71) Applicant: SPTS Technologies Limited, Newport (GB)

(72) Inventors: Stephen Burgess, Newport (GB); Kathrine Crook, Newport (GB); Daniel Archard, Newport (GB); William Royle, Newport (GB); Euan Alasdair Morrison, Newport (GB)

(73) Assignee: SPTS Technologies Limited, Newport (GB)

( * ) Notice: Subject to any disclaimer, the term of this patent is extended or adjusted under 35 U.S.C. 154(b) by 0 days.

(21) Appl. No.: 17/144,699

(22) Filed: Jan. 8, 2021

(65) Prior Publication Data
US 2021/0246555 A1  Aug. 12, 2021

(30) Foreign Application Priority Data
Feb. 10, 2020 (GB) .................................... 2001781

(51) Int. Cl.
*C23C 16/40* (2006.01)
*C23C 16/513* (2006.01)
*C23C 16/455* (2006.01)

(52) U.S. Cl.
CPC .......... *C23C 16/513* (2013.01); *C23C 16/455* (2013.01)

(58) Field of Classification Search
CPC ..... C23C 16/513; C23C 16/455; C23C 16/04; C23C 16/401; C23C 16/45565; C23C 16/505; C23C 16/4583; C23C 16/5096; C23C 16/4404; C23C 16/4581;
(Continued)

(56) References Cited

U.S. PATENT DOCUMENTS 10,465,288 B2 * 11/2019 Mishra .............. C23C 16/45565
11,053,590 B2 *  7/2021 Mishra ................ H01J 37/3244
2003/0186501 A1  10/2003 Rueger
(Continued)

FOREIGN PATENT DOCUMENTS

| CN | 102017083 A | 4/2011 |
| CN | 102859647 A | 1/2013 |
| CN | 103460347 A | 12/2013 |

OTHER PUBLICATIONS

IPO, Office Action for GB Application No. 2001781.0, dated Jul. 9, 2020.
(Continued)

*Primary Examiner* — Rudy Zervigon
(74) *Attorney, Agent, or Firm* — HODGSON RUSS LLP

(57) ABSTRACT

A capacitively coupled Plasma Enhanced Chemical Vapour Deposition (PE-CVD) apparatus has a chamber, a first electrode with a substrate support positioned in the chamber, a second electrode with a gas inlet structure positioned in the chamber, and an RF power source connected to the gas inlet structure for supplying RF power thereto. The gas inlet structure has an edge region, a central region which depends downwardly with respect to the edge region, and one or more precursor gas inlets for introducing a PE-CVD precursor gas mixture to the chamber. The edge region and the central region both constitute part of the second electrode. The precursor gas inlets are disposed in the edge region and the central region is spaced apart from the substrate support to define a plasma dark space channel.

11 Claims, 3 Drawing Sheets

(58) Field of Classification Search
CPC ........... H01J 37/32091; H01J 37/32385; H01J 37/3244; H01J 37/32449; H01J 37/32477
USPC ..... 118/723 E, 723 ER; 156/345.43, 345.44, 156/345.45, 345.46, 345.47
See application file for complete search history.

(56) References Cited

U.S. PATENT DOCUMENTS

| | | | | |
|---|---|---|---|---|
| 2006/0000803 | A1* | 1/2006 | Koshiishi | H01J 37/32082 156/345.47 |
| 2006/0169671 | A1* | 8/2006 | Miya | H01L 21/32137 156/345.33 |
| 2007/0187363 | A1* | 8/2007 | Oka | H01J 37/32449 156/345.33 |
| 2007/0251917 | A1* | 11/2007 | Bera | H01L 21/31116 216/74 |
| 2007/0254486 | A1* | 11/2007 | Bera | H01L 21/76802 257/E21.252 |
| 2009/0014127 | A1* | 1/2009 | Shah | H01J 37/32366 156/345.29 |
| 2009/0117746 | A1* | 5/2009 | Masuda | H01L 21/67069 118/723 R |
| 2012/0094502 | A1 | 4/2012 | Shin et al. | |
| 2015/0020848 | A1 | 1/2015 | Kim et al. | |
| 2016/0047040 | A1* | 2/2016 | Mishra | H01J 37/3244 118/723 R |
| 2017/0294294 | A1 | 10/2017 | Haymore et al. | |
| 2020/0017972 | A1* | 1/2020 | Mishra | C23C 16/50 |

OTHER PUBLICATIONS

CNIPA, Office Action for CN Application No. 202110017476.6, dated Jun. 21, 2023.

* cited by examiner

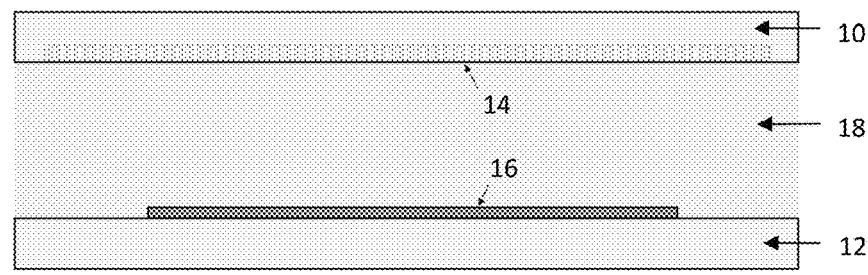
Figure 1 - PRIOR ART
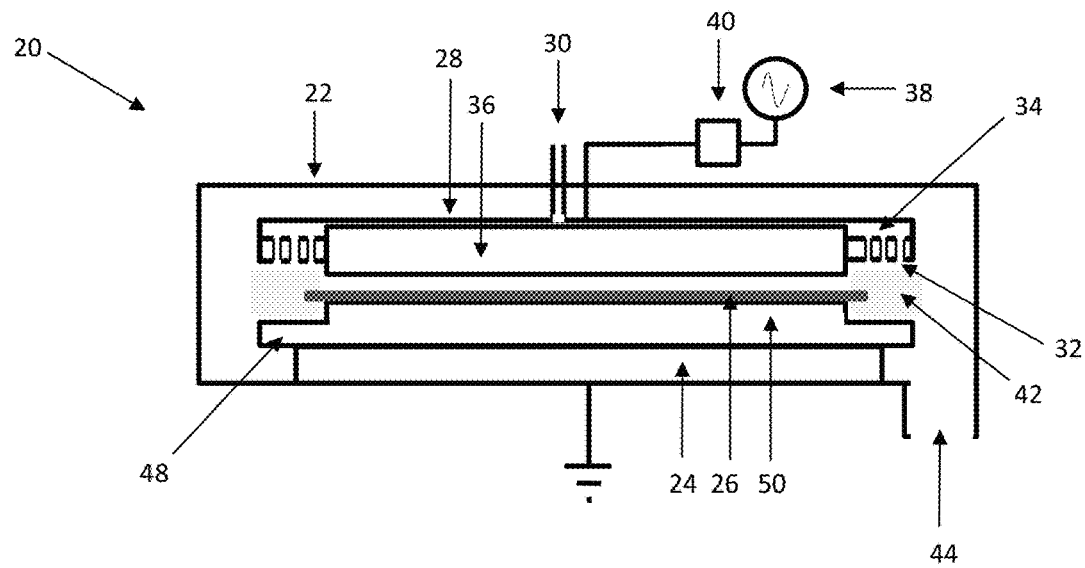
Figure 2
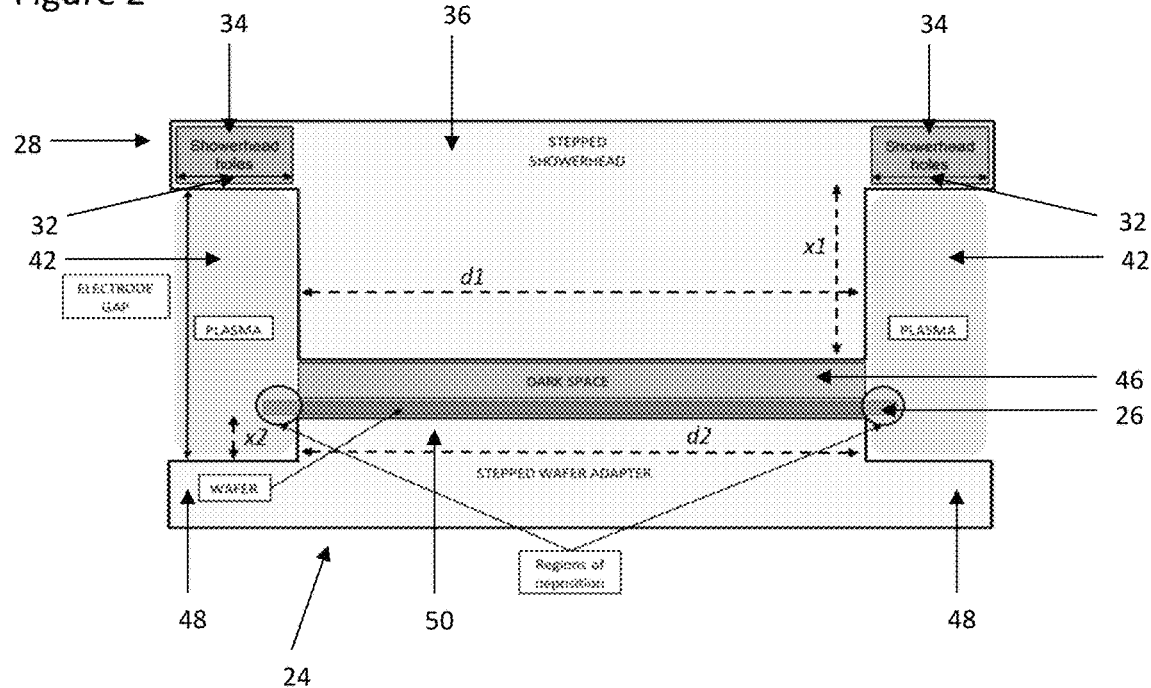
Figure 3

PE-CVD APPARATUS AND METHOD

CROSS-REFERENCE TO RELATED APPLICATIONS

This application claims priority to UK Patent Application No. 2001781.0 filed Feb. 10, 2020, the disclosure of which is hereby incorporated by reference.

FIELD OF THE DISCLOSURE

The present invention relates to a capacitively coupled Plasma Enhanced Chemical Vapour Deposition (PE-CVD) apparatus. The invention also relates to a method of depositing a material onto a peripheral region of a substrate by capacitively coupled PE-CVD.

BACKGROUND OF THE DISCLOSURE

Etching is the well-known process in the manufacture of semiconductor devices in which a selected portion of a semiconductor substrate is removed, either as a precursor to deposition of other layers or for the altered geometry created by the etch itself. Typically, the semiconductor substrate is a wafer. When performing a wafer etch process it is necessary to shield the surface of the wafer that is intended to remain unetched. The surface of the wafer that requires protection typically includes the peripheral region of the wafer around the wafer edge. Conventionally this may be done by application of a photoresist polymer over the surface to be protected. However, the chemicals in the photoresist may interfere with the etching process, especially when performing bulk silicon etches. Therefore, there is a desire for an alternative method of protecting the peripheral region of a wafer which does not require the use of photoresists and which does not interfere with the etching process to any undesirable extent. However, any such alternative should be convenient to implement and preferably compatible with existing semiconductor processing technologies. Also, any alternative method should be sufficiently controllable that protection is provided in the desired peripheral areas of the wafer and not in areas of the wafer which are intended to remain exposed and unprotected.

BRIEF SUMMARY OF THE DISCLOSURE

The present invention, in at least some of its embodiments, is directed to one or more of the problems, desires and needs disclosed above. Furthermore, the present inventors have realised that their invention is more generally applicable than this. In particular, the present invention can provide location-specific deposition of a range of materials onto the peripheral regions of a range of substrates.

In accordance with a first aspect of the invention there is provided a capacitively coupled Plasma Enhanced Chemical Vapour Deposition (PE-CVD) apparatus comprising:
  a chamber;
  a first electrode comprising a substrate support positioned in the chamber;
  a second electrode comprising a gas inlet structure positioned in the chamber, the gas inlet structure comprising an edge region, a central region which depends downwardly with respect to the edge region, and one or more precursor gas inlets for introducing a PE-CVD precursor gas mixture to the chamber, the edge region and the central region both constituting part of the second electrode, wherein the precursor gas inlets are disposed in the edge region and the central region is spaced apart from the substrate support to define a plasma dark space channel; and
  an RF power source connected to the gas inlet structure for supplying RF power thereto.

In accordance with a second aspect of the invention there is provided a method of depositing a material onto a peripheral region of a substrate by capacitively coupled Plasma Enhanced Chemical Vapour Deposition (PE-CVD) comprising the steps of:
  providing an apparatus comprising: a chamber; a first electrode comprising a substrate support positioned in the chamber; a second electrode comprising a gas inlet structure positioned in the chamber, the gas inlet structure comprising an edge region, a central region which depends downwardly with respect to the edge region, and one or more precursor gas inlets for introducing a PE-CVD precursor gas mixture to the chamber, the edge region and the central region both constituting part of the second electrode, wherein the precursor gas inlets are disposed in the edge region and the central region is spaced apart from the substrate support to define a plasma dark space channel; and an RF power source connected to the gas inlet structure for supplying RF power thereto;
  positioning the substrate on the substrate support; and
  performing a capacitively coupled PE-CVD process in which RF power is supplied to the gas inlet structure to generate a plasma which has a dark space in the plasma dark space channel, thereby causing the material to be deposited only onto a peripheral region of a substrate.

In this way it is possible to deposit material by PE-CVD in a location-specific manner at the periphery of a substrate. The location of the deposition and other deposition characteristics, such as the deposition thickness and thickness distribution, can be controlled by controlling the structural characteristics of elements in the chamber, such as the gas inlet structure, and also by controlling the process conditions.

The substrate support can comprise an edge region and a central region for receiving a substrate, the central region being raised with respect to the edge region, wherein the central region of the gas inlet structure is spaced apart from the central region of the substrate support to define the plasma dark space channel. The substrate can be wider than the central region of the substrate support and have a front surface, a back surface, and an edge surface which connects the front and back surfaces so that, when the substrate is positioned on the substrate support, the front surface faces the gas inlet structure, the back surface faces away from the gas inlet structure, and the peripheral region of the substrate extends beyond the central region of the substrate support thereby exposing the back surface of the peripheral region to plasma. Then, the step of performing the capacitively coupled PE-CVD process can cause the material to be deposited onto the back surface in the peripheral region of the substrate. The step of performing the capacitively coupled PE-CVD process can also cause the material to be deposited onto the edge region and the front surface in the peripheral region of the substrate.

The central region of the gas inlet structure can be generally opposite the central region of the substrate support.

The spacing between the central region of the gas inlet structure and the substrate support can be considered to be the depth of the plasma dark space channel. It is noted that we define the plasma dark space channel in terms of the spacing between the central region of the gas inlet structure and the substrate support. It is recognised that during processing the substrate is in place on the substrate support and therefore the effective gap in which the plasma dark space can form is the plasma dark space depth minus the thickness of the substrate. The spacing between the central region of the gas inlet structure and the substrate support can be in the range 2 to 20 mm. This spacing is particularly applicable for standard $SiO_2$ process conditions (RF power, pressure, gas flows, etc.).

In general, the first and second electrodes are each formed from an electrically conductive material. At least one of the gas inlet structure and the substrate support can be formed from a metallic material, optionally aluminium. The aluminium used can have an anodized surface such as $Al_2O_3$.

The central region and the edge region of the gas inlet structure can both formed from a metallic material and be in electrical contact with each other.

The central region of the gas inlet structure can depend downwardly with respect to the edge region of the gas inlet structure to a depth of at least 5 mm. This depth can be in the range 5 to 45 mm. This depth can be in the range 5 to 25 mm.

The central region of the substrate support can be raised with respect to the edge region of the substrate support by a height in the range 1 to 25 mm. The central region of the substrate support can be raised with respect to the edge region of the substrate support by a height in the range 1 to 10 mm.

The material deposited by the capacitively coupled PE-CVD process can be a protective material which protects the substrate during a subsequent etching process. In this way, protective collar can be formed around the edge of the substrate. The protective material can be a dielectric material, such as an oxide dielectric material, or a semiconductor material. The protective material can be a silicon oxide. We use the term 'silicon oxide' because this is well recognised and widely used in the semiconductor industry. However, the skilled reader will understand that the stoichiometry of the deposited silicon oxide film is $SiO_2$ or close to $SiO_2$. Any suitable the PE-CVD precursor gas mixture can be used to deposit the silicon oxide. For example, the PE-CVD precursor gas mixture can comprise $SiH_4$ or tetraethyl orthosilicate (TEOS). The PE-CVD precursor gas mixture can comprise $SiH_4$ and $N_2O$, $SiH_4$ and $O_2$, or TEOS and $O_2$ and/or $O_3$. Alternatively, the protective material can be SiN, SiON, SiOC or SiC.

The central region of the gas inlet structure can have a characteristic horizontal dimension $D_1$. The substrate can have a corresponding characteristic horizontal dimension D. The ratio $D_1/D$ can be in the range 1.1 to 0.9, preferably 1.05 to 0.95. The characteristic horizontal dimension can be a diameter, for example where the substrate is a circular wafer and the central region of the gas inlet structure has a circular lower surface.

The central region of the substrate support can have a characteristic horizontal dimension $D_2$. The substrate can have a corresponding characteristic horizontal dimension D. The ratio $D_2/D$ can be in the range 0.7 to 0.98, preferably 0.7 to 0.95. The characteristic horizontal dimension can be a diameter, for example where the substrate is a circular wafer and the central region of the gas inlet structure has a circular lower surface.

The central region of the gas inlet structure can be a stepped protrusion surrounded by the edge region of the gas inlet structure. When the substrate is circular, such as a circular semiconductor wafer, the central region of the gas inlet structure can comprise a cylindrical protrusion. In these embodiments, the edge region of the gas inlet structure can be an annular structure. Alternatively, central region of the gas inlet structure can have a side or sides which are not perpendicular to the edge region of the gas inlet structure, such as sloping or bevelled sides.

The apparatus can be configured so that the spacing between the central region of the gas inlet structure and the substrate support can be varied during the course of a capacitively coupled PE-CVD process performed in the apparatus. Thus, the spacing between the central region of the gas inlet structure and the substrate support can be varied during the course of the capacitively coupled PE-CVD process. The apparatus can comprise an arrangement for raising and lowering the substrate support so that the spacing between the central region of the gas inlet structure and the substrate support can be varied during the course of a capacitively coupled PE-CVD process performed in the apparatus.

The substrate can be a wafer.

The substrate can be a semiconductor substrate, such as a silicon wafer.

Whilst the invention has been described above, it extends to any inventive combination of features set out above or in the following description. For example, features described in relation to one aspect of the invention are disclosed in relation to another aspect of the invention. Although illustrative embodiments of the invention are described in detail herein with reference to the accompanying drawings, it is to be understood that the invention is not limited to these precise embodiments. Furthermore, it is contemplated that a particular feature described either individually or as part of an embodiment can be combined with other individually described features, or parts of other embodiments, even if the other features and embodiments make no mention of the particular feature. Thus, the invention extends to such specific combinations not already described.

DESCRIPTION OF THE DRAWINGS

The invention will now be described, by way of example only, with reference to the accompanying drawings, in which:

FIG. 1 is a side view of the showerhead and substrate support of a prior art PE-CVD apparatus;

FIG. 2 is a cutaway side view of a PE-CVD apparatus of the invention;

FIG. 3 is a semi-schematic side view of the gas inlet structure and substrate support of the PE-CVD apparatus of FIG. 2;

DETAILED DESCRIPTION OF THE DISCLOSURE

Figure 4:
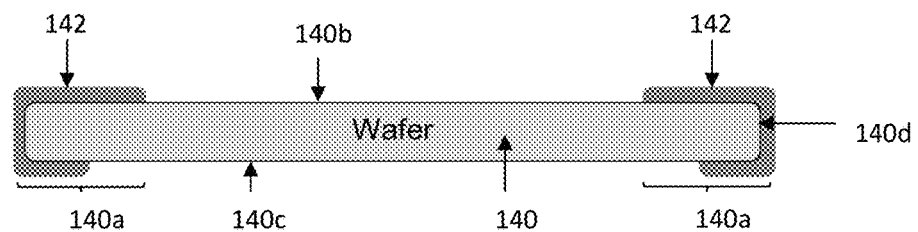
FIG. 4 is a vertical cross-section through a wafer substrate following deposition of material using the apparatus shown in FIGS. 2 and 3.

FIG. 1 shows a portion of a conventional, prior art capacitively coupled PE-CVD reactor which comprises a gas inlet structure of the 'showerhead' type 10 and a substrate support 12. The conventional showerhead structure shown in FIG. 1 is in the form of a disc comprising a flat lower surface. The showerhead 10 has a plurality of precursor gas inlets 14 distributed over a substantial portion of the lower surface in order to provide a relatively homogeneous spatial distribution of precursor gas into the chamber. The substrate support 12 is also of conventional design, having a flat upper surface on which a substrate such as a wafer 16 is positioned. The width of the wafer is always smaller than the width of the substrate support. The gas inlet structure 10 and the substrate support 12 act as parallel plate electrodes in a capacitively coupled plasma generation reactor to produce a plasma 18. The plasma 18 assists in the PE-CVD process which deposits a desired material on the front surface of the wafer 16. It should be noted that this prior art configuration results in the deposition of the material all over the front surface of the wafer 16. Whilst deposition may occur onto the edges of the wafer, deposition cannot occur onto the back surface of the wafer, since the back surface is in contact with the upper surface of the substrate support and has no exposure to the plasma and the process gases.

The present invention provides a configuration for a PE-CVD apparatus which enables location-specific deposition onto the substrate. In particular, the present invention enables deposition onto desired peripheral regions of the substrate without deposition occurring on more central regions of the substrate. This can be achieved using a different type of gas inlet structure to the conventional design shown in FIG. 1. More specifically, a gas inlet structure can be used which comprises an edge region and a central region. The precursor gas inlets are disposed in the edge region. In an orientation in which the precursor gas inlets are facing upwards, the central region is raised with respect to the edge region. When the gas inlet structure is positioned near the top of a PE-CVD apparatus, the precursor gas inlets face downwards towards the substrate support and the central region depends downwardly with respect to the edge region.

FIGS. 2 and 3 show a PE-CVD apparatus of the invention, depicted generally at 20, comprising a chamber 22 having a substrate support 24 positioned therein. The substrate support 24 may be a platen on which a semiconductor wafer 26 can be positioned. The substrate support can further comprise a platen support and an internal heating/cooling system, as is well known in the art. It is possible for the platen to be moveable between a lowered position for receiving the wafer and a raised, in-use, position for processing the wafer by PE-CVD and/or to modify the gap between the wafer surface and the second electrode. The apparatus 20 further comprises a gas inlet structure 28 positioned at the top of the chamber 22. A desired precursor gas or precursor gaseous mixture is introduced into the gas inlet structure 28 from a gas supply system (not shown) through a conduit 30. The gas inlet structure 28 comprises a plurality of precursor gas inlets 32 disposed in an edge region 34 of the gas inlet structure 28 and therefore gas introduced from the conduit 30 subsequently enters the interior of the chamber 22 through the plurality of precursor gas inlets 32. Typically, a precursor gaseous mixture is supplied to the chamber 22 which comprises one or more process gases, optionally in combination with one or more carrier gases. The gas inlet structure 28 further comprises a central region 36 which depends downwardly with respect to the edge region 34.

The substrate support 24 acts the first electrode and the gas inlet structure 28 acts as a second electrode of a capacitively coupled plasma production device. The substrate support and the gas inlet structure can be formed of aluminium or another suitable conductive material. The substrate support 24 is held at ground. The gas inlet structure 28 is a driven electrode by virtue of its connection to a RF power supply 38 via a RF matching network 40. In this way, a plasma 42 is created in the chamber 22 which leads to deposition of material on the semiconductor wafer 26 by a desired PE-CVD process. Gases are removed from the chamber 22 via an exhaust 44. It is possible to use a secondary RF supply which might be connected to the gas inlet structure or the substrate support to provide a mixed frequency RF. The central region 36 of the gas inlet structure 28 is spaced apart from the substrate support 24 to define a channel, herein termed the plasma dark space channel. The depth to which the central region 36 depends downwardly below the lower surface of the edge region 34 is shown in FIG. 3 as x1 and the width of the central region 36 is shown as d1. A desired plasma dark space channel 46 is created with an associated plasma dark space channel depth. This enables a plasma dark space to be created along at least a portion of the channel 46 through appropriate selection of x1 and of the separation of the substrate support 24 from the gas inlet structure 28 for the process conditions employed. It should be noted that during processing, a plasma dark space might not be created along the entire width of the plasma dark space channel 46. Instead, plasma might extend into the plasma dark space channel 46. As explained in more detail below, various structural and process parameters can be varied to control the extent to which the plasma extends into the plasma dark space channel which in turn controls the extent to which material is deposited towards the centre of the substrate. However, the existence of a plasma dark space in the plasma dark space channel has the consequence that material is deposited onto a peripheral region of the substrate and is not deposited onto a more central region of the substrate.

In the embodiment shown in FIGS. 2 and 3, the substrate support 24 is also of unconventional design. More specifically, the substrate support 24 comprises an edge region 48 and a central region 50 for receiving the substrate 26. The central region 50 of the substrate support 24 has a width d2 and is raised with respect to the edge region 48 by a distance x2. If the substrate 26 is a wafer of circular cross-section then the central region 50 of the substrate support 24 is typically a step portion of circular cross-section and d2 is a diameter. d2 is selected to be smaller than the corresponding width of the substrate 26 so that, when the substrate 26 is positioned on the substrate support 24, the substrate 26 extends beyond the central region 50 to overhang the edge region 48. In this way, a peripheral region of the back surface of the substrate 26 is unprotected by the substrate support 24. Instead, this peripheral region of the back surface of the substrate 26 is exposed to the plasma 42 or at least to diffusion of active precursor species which enables material to be deposited onto it.

FIG. 4 shows a vertical cross-section of a wafer substrate 140 following deposition of material 142 using the apparatus shown in FIGS. 2 and 3. In the peripheral region of the wafer substrate 140, material 142 is deposited onto the front 140b and back 140c surfaces and onto the edge surface 140d which connects the front 140a and back 140b surfaces. The deposited material 142 forms a continuous collar structure at the periphery of the substrate 140 having (as shown in FIG. 4) a canaliculate shape in a vertical cross-section. It will be appreciated that the material 142 can be deposited to form a protective structure to shield the edge region of the substrate. Accordingly, the deposited material may be a material that performs a useful protective function, either to protect the substrate during its ultimate end-use or to protect the substrate during a subsequent processing or other manufacturing step. For example, when the substrate is a semiconductor substrate the material may be an etch-resistant material which protects the edge region of the substrate during a subsequent etch step. An example of a suitable etch-resistant material is silicon oxide. Other protective materials which can be deposited by PE-CVD might be used, such as SiN, SiON, SiOC or SiC. However, the invention is not limited to the deposition of materials that perform a protective function. In principle, any material that can be deposited by PE-CVD might be deposited in accordance with the invention in a location-specific manner at the periphery of the substrate.

In an alternative embodiment, a conventional substrate support can be used instead of the non-conventional substrate support shown in FIGS. 2 and 3. The conventional substrate support has a flat upper surface for receiving the substrate. The substrate is smaller than the upper surface of the substrate support and is positioned entirely within the boundary of the upper surface. In other words, the positioning of the substrate with respect to the substrate support is generally as shown in the lower portion of FIG. 1. Accordingly, the back surface of the substrate is not exposed to the plasma and material is not deposited onto it. Instead, material is deposited onto the front surface in the peripheral region of the substrate. In the case of deposition onto a circular substrate such as a circular semiconductor wafer, this results in a generally annular front side deposition pattern. Material may also be deposited onto the edge of the substrate.

Figure 5:
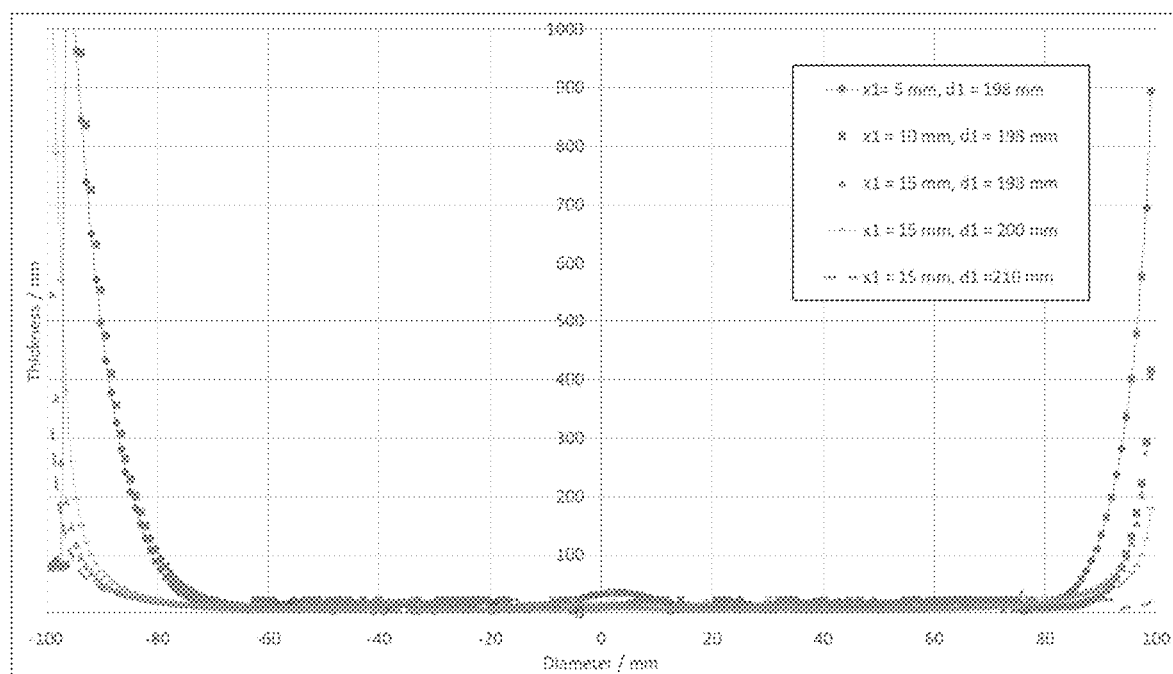
FIG. 5 shows front surface deposition thickness profiles as a function of wafer diameter for different configurations and dimensions of the central region of the gas inlet structure.
Figure 6:
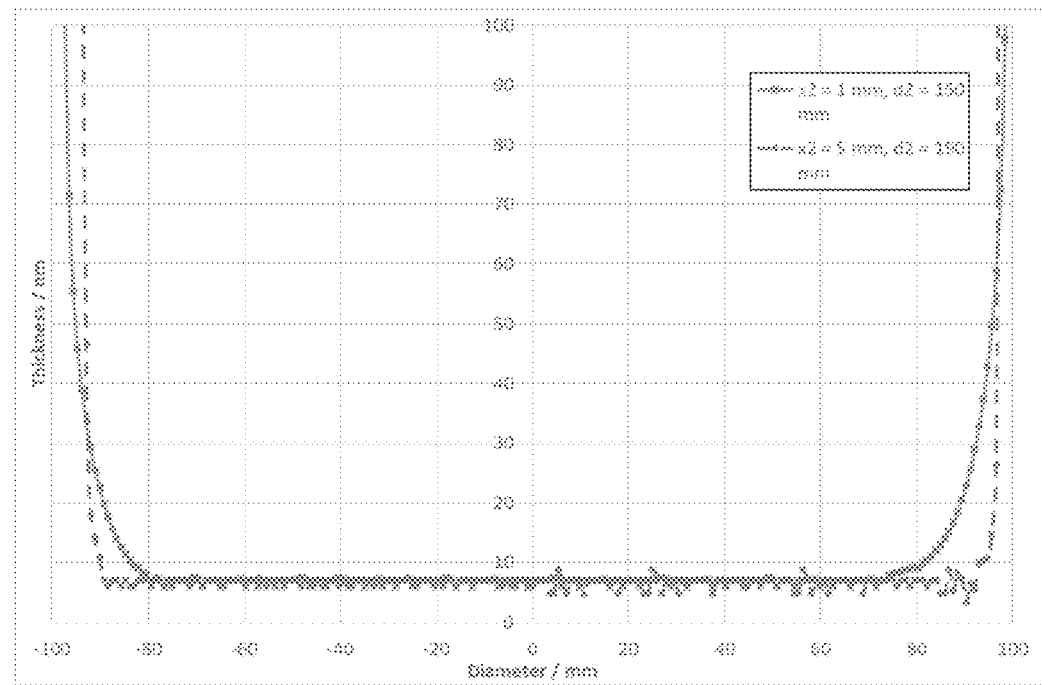
FIG. 6 shows back surface deposition thickness profiles as a function of wafer diameter for different configurations and dimensions of the central region of the gas inlet structure.

The structural characteristics of the substrate support and the gas inlet structure can be varied in order to control the location specific deposition of material onto the substrate. In a series of experiments silicon oxide was deposited onto 200 mm diameter silicon wafers using the apparatus shown in FIGS. 2 and 3. In these experiments, the dimensions x1, d1, x2 and d2 were varied to alter both the thickness of the deposited layer of silicon oxide and the extent to which the deposition extends radially inward towards the centre of the wafer. The silicon oxide was deposited using a precursor gas mixture of 2.5% $SiH_4$ in $N_2O$, with a total gas flow of 820 sccm. The wafer temperature was 150° C. and the chamber pressure was 350 mTorr. A 13.56 MHz RF power of 360 W was applied to the gas inlet structure. The gap between the lower surface of the edge region and the front surface of the wafer substrate was 26 mm so that when x1 was 15 mm, the plasma dark space channel depth was 11 mm, when x1 was 10 mm, the plasma dark space channel depth was 16 mm and when x1 was 5 mm, the plasma dark space channel depth was 21 mm. The results are shown in FIGS. 5 and 6. FIG. 5 shows deposition profiles onto the front surface of the wafer for different configurations and dimensions of the central region of the gas inlet structure. The thickness of the deposition as a function of wafer diameter is shown. The noise observed in the central region of the wafer is due the metrology used. Some offset is observed in the x axis due to the manual placement of the wafers.

The results show that by reducing the space between the central region of the gas inlet structure and the front surface of the wafer, the thickness of the deposited layer can be reduced and the extent to which the deposition extends radially inward of the wafer edge can be reduced. The radially inward extent of the deposition can also be tuned by varying the diameter of the central region of the gas inlet structure. Deposition thicknesses of 200 nm to 3000 nm have been shown to be possible with differing deposition profiles as a function of wafer diameter.

FIG. 6 shows deposition profiles onto the back surface of the wafer for different configurations and dimensions of the central region of the substrate support. The thickness of the deposition as a function of wafer diameter is shown. The noise observed in the central region of the wafer is due the metrology used. FIG. 6 shows that both the deposition thickness and the extent to which the deposition extends radially inward of the wafer edge rate of dissipation can be varied by adapting the geometry of the central region of the substrate support. It should also be noted that there is a steep fall off in the deposition thickness for the d2=190 mm trace at −95 and 95 mm along the wafer. This is due to the physical barrier of the stepped central portion preventing deposition beyond these points.

Figure 7:
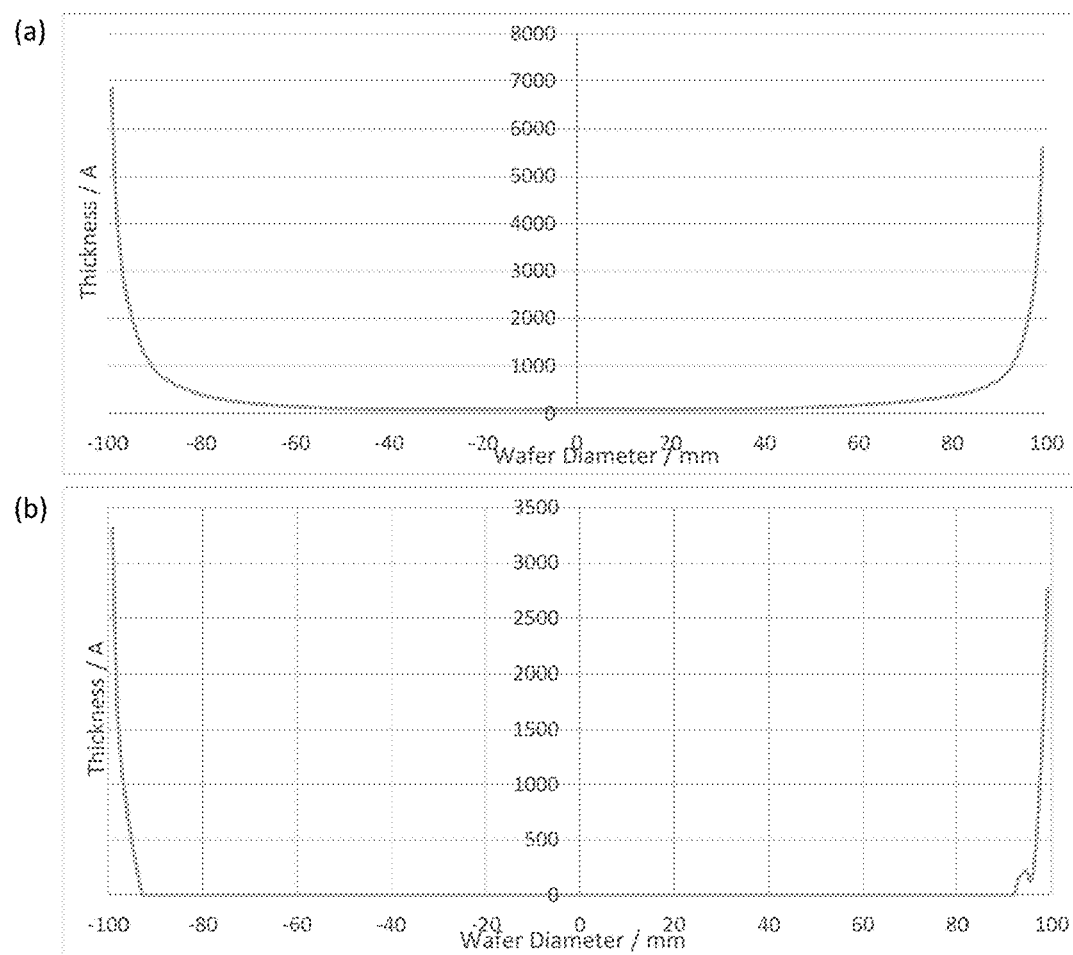
FIG. 7 shows (a) front and (b) back surface deposition thickness profiles as a function of wafer diameter for the deposition of silicon oxide onto a 200 mm diameter silicon wafer.

As noted above, by using the apparatus of FIGS. 2 and 3 it is possible to deposit a protective collar around the edge of the wafer edge. FIG. 7 shows silicon oxide deposition profiles on (a) the front surface and (b) the back surface of a wafer, indicating that a protective structure of the kind shown schematically in FIG. 4 was realised.

Without wishing to be bound by any particular theory or conjecture, it is believed that a plasma dark space can be produced in the plasma dark space channel. In the absence of a plasma in this region, material is not deposited onto the central regions of the substrate that lie underneath the plasma dark space other than deposition that might occur due to diffusion of active precursor species into the plasma dark space. Again, without wishing to be bound by any particular theory or conjecture, two mechanisms are proposed by which the plasma dark space might be created. Firstly, the downwardly depending central region acts as a protrusion which decreases the separation between the first and second electrodes in the capacitively coupled plasma system so that the discharge impedance is increased to an inaccessible level in the plasma dark space channel. Put another way, the breakdown voltage to initiate a plasma to a first approximation depends on the P (pressure) and the D (distance) between the anode & cathode in the capacitively coupled plasma reactor. The present invention provides a low D in the plasma dark space channel, and the conditions used can be selected so that the product P×D results in a prohibitively large breakdown voltage being required to initiate a plasma. Physically, this may be associated with the distance D being much less than the mean free path of gas molecules in the plasma dark space channel region. Secondly, the lack of gas inlets in the central region of the gas inlet structure helps to prevent precursor gases being delivered to the plasma dark space channel (the central region of the gas inlet structure may also act as a physical barrier which inhibits precursor gases entering the chamber from the gas inlets in the edge from accessing the plasma dark space channel, especially when a circumferential pumping system is used in which gases are exhausted from a peripheral region of the chamber).

The invention can be implemented in different ways, and the skilled reader will appreciate that various modifications and variants of the embodiments described above are possible. For example, it may be possible to use gas inlet structures having differently configured central regions, such as central regions having one or more sides that are not perpendicular to the edge region but rather are sloped, bevelled or otherwise non-perpendicular to the base of the gas inlet structure.

What is claimed is:

1. A capacitively coupled Plasma Enhanced Chemical Vapour Deposition (PE-CVD) apparatus comprising:
    a chamber;
    a first electrode comprising a substrate support positioned in the chamber;
    a second electrode comprising a gas inlet structure positioned in the chamber, the gas inlet structure comprising an edge region, a central region which protrudes downwardly with respect to the edge region such that the central region protrudes farther into the chamber than the edge region by a depth from 5 mm to 45 mm, and one or more precursor gas inlets for introducing a PE-CVD precursor gas mixture to the chamber, the edge region and the central region both constituting part of the second electrode, wherein the precursor gas inlets are disposed in the edge region and the central region is spaced apart from the substrate support to define a plasma dark space channel; and
    an RF power source connected to the gas inlet structure for supplying RF power thereto.

2. The apparatus according to claim 1 in which the substrate support comprises an edge region and a central region for receiving a substrate, the central region being raised with respect to the edge region, wherein the central region of the gas inlet structure is spaced apart from the central region of the substrate support to define the plasma dark space channel.

3. The apparatus according to claim 2 in which the central region of the gas inlet structure is generally opposite the central region of the substrate support.

4. The apparatus according to claim 2 in which spacing between the central region of the gas inlet structure and the substrate support is in a range from 2 to 20 mm.

5. The apparatus according to claim 1 in which at least one of the gas inlet structure and the substrate support are formed from a metallic material.

6. The apparatus according to claim 5 in which the central region and the edge region of the gas inlet structure are both formed from the metallic material and are in electrical contact with each other.

7. The apparatus according to claim 1 in which the central region of the gas inlet structure protrudes downwardly with respect to the edge region of the gas inlet structure to a depth in a range from 5 to 45 mm.

8. The apparatus according to claim 1 in which a spacing between the central region of the gas inlet structure and the substrate support is configured to be varied during a course of a capacitively coupled PE-CVD process performed in the apparatus.

9. The apparatus according to claim 1 in which the precursor gas inlets of the gas inlet structure are only disposed in the edge region.

10. The apparatus according to claim 1 in which the precursor gas inlets are all disposed in the gas inlet structure.

11. The apparatus according to claim 1 in which the only gas inlets in the apparatus are the precursor gas inlets of the gas inlet structure, and wherein the precursor gas inlets are only disposed in the edge region.

* * * * *